United States Patent
Zhao et al.

(10) Patent No.: US 11,115,940 B2
(45) Date of Patent: Sep. 7, 2021

(54) METHOD FOR OBTAINING NOISE POWER AND TERMINAL

(71) Applicant: CHINA ACADEMY OF TELECOMMUNICATIONS TECHNOLOGY, Beijing (CN)

(72) Inventors: Li Zhao, Beijing (CN); Rui Zhao, Beijing (CN); Ying Peng, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/982,509

(22) PCT Filed: Mar. 19, 2019

(86) PCT No.: PCT/CN2019/078630
§ 371 (c)(1),
(2) Date: Sep. 18, 2020

(87) PCT Pub. No.: WO2019/179412
PCT Pub. Date: Sep. 26, 2019

(65) Prior Publication Data
US 2021/0022093 A1 Jan. 21, 2021

(30) Foreign Application Priority Data
Mar. 19, 2018 (CN) .......................... 201810224956.8

(51) Int. Cl.
*H04W 52/52* (2009.01)
*H04W 52/24* (2009.01)

(52) U.S. Cl.
CPC ......... *H04W 52/52* (2013.01); *H04W 52/243* (2013.01)

(58) Field of Classification Search
CPC ................................. H04W 52/52; H04B 1/12
(Continued)

(56) References Cited

U.S. PATENT DOCUMENTS

| 6,748,200 B1 | 6/2004 | Webster et al. |
| 2002/0115419 A1* | 8/2002 | Le Naour ................ H04N 5/52 455/232.1 |

(Continued)

FOREIGN PATENT DOCUMENTS

| CN | 1371214 A | 9/2002 |
| CN | 1497992 A | 5/2004 |

(Continued)

OTHER PUBLICATIONS

First Office Action in Chinese Application No. 201810224956.8, dated Apr. 3, 2020.
(Continued)

*Primary Examiner* — John J Lee
(74) *Attorney, Agent, or Firm* — Ladas & Parry, LLP (57) ABSTRACT

A method for obtaining a noise power and a terminal are provided. The obtaining method includes: obtaining a first power offset value of an actual automatic gain control (AGC) received power relative to a first predetermined received power within a predetermined transmission time interval (TTI); obtaining, according to a preset correspondence between a modulation mode and an AGC backoff value, a target AGC backoff value corresponding to a current modulation mode; and obtaining the noise power according to the first power offset value, the target AGC backoff value, and a current AGC received power.

18 Claims, 3 Drawing Sheets

(58) Field of Classification Search
USPC ...... 455/522, 69, 232.1, 240.1, 245.1, 250.1
See application file for complete search history.

(56) References Cited

U.S. PATENT DOCUMENTS

| | | | |
|---|---|---|---|
| 2003/0162518 A1 | 8/2003 | Baldwin et al. | |
| 2005/0054383 A1 | 3/2005 | Webster et al. | |
| 2007/0242768 A1 | 10/2007 | Wallace et al. | |
| 2007/0287400 A1* | 12/2007 | Yu | H03G 3/3068 455/232.1 |
| 2008/0165904 A1* | 7/2008 | Sidi | H03G 3/3089 375/345 |
| 2009/0088112 A1* | 4/2009 | Nonin | H03G 3/3068 455/234.1 |

FOREIGN PATENT DOCUMENTS

| | | |
|---|---|---|
| CN | 101427506 A | 5/2009 |
| CN | 101578838 A | 11/2009 |
| CN | 101926144 A | 12/2010 |
| CN | 102299874 A | 12/2011 |
| CN | 103338165 A | 10/2013 |
| CN | 107809258 A | 3/2018 |

OTHER PUBLICATIONS

3GPP TSG RAN WG1 Meeting #89, "Remaining details of evaluation methodology for short TTI in R15 sidelink", R1-1707005, Agenda Item 6.2.3.3.1, May 2017.
International Search Report in the international application No. PCT/CN2019/078630, dated Jun. 4, 2019.
Written Opinion of the International Searching Authority in the international application No. PCT/CN2019/078630, dated Jun. 4, 2019 with English translation provided by Google Translate.
3GPP TSG RAN WG1 Meeting #91, "Evaluations for shorten TTI in PC5", R1-1720166, Agenda Item 6.2.3.6, Nov. 2017.
Extended European Search Report from EP app. No. 19771078.3, dated Apr. 1, 2021.

* cited by examiner

METHOD FOR OBTAINING NOISE POWER AND TERMINAL

CROSS-REFERENCE TO RELATED APPLICATIONS

This application is the U.S. national phase of PCT Application No. PCT/CN2019/078630 filed on Mar. 19, 2019, which claims a priority to Chinese Patent Application No. 201810224956.8 filed on Mar. 19, 2018, the disclosures of which mare incorporated in their entireties by reference herein.

TECHNICAL FIELD

The present disclosure relates to the field of communication applications, and in particular to a method for obtaining a noise power and a terminal.

BACKGROUND

A receiver of a wireless communication terminal needs to undergo analog automatic gain control (Automatic Gain Control, AGC) processing. After an analog signal is amplified or reduced, the signal is sampled and processed through an analog-to-digital converter (Analog-to-Digital Converter, ADC), and the signal can fall within a reasonable A/D range. Generally, the receiver of the terminal sets the AGC backoff value according to the number of AGC bits that is supported, that is, setting a reasonable AGC target value to ensure a received power to be surplus, so that the receiver can set a reasonable AGC processing range.

Figure 1:
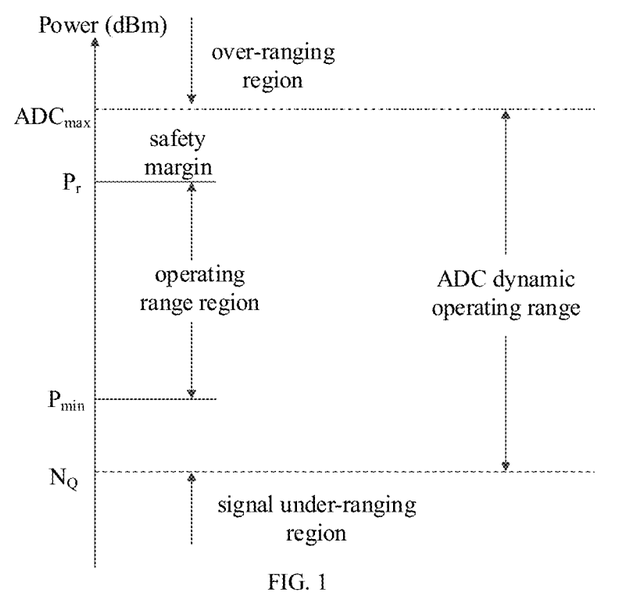
FIG. 1 is a schematic diagram of analog AGC implementation.

A schematic diagram of the analog AGC implementation is shown in FIG. 1, where three regions are defined: an over-ranging region (Over-ranging region), an operating range region (Operating range region) and a signal under-ranging region (Under-ranging region). Since a reception signal in the over-ranging region is so strong that the receiver is saturated and unable to receive the signal; while a reception signal in the signal under-ranging region is so weak that the receiver is unable to distinguish the effective received signal. The two regions are intervals where the receiver cannot work normally during AGC reception, and should be avoided as much as possible.

An input power cannot exceed ADCmax, otherwise the received signal is saturated; in order to meet the minimum requirement on signal to noise ratio (Signal to Noise Ratio, SNR), the input power cannot be lower than Pmin. Considering the jitter of the received signal power, a safety margin (Safety Margin) is set, so that even if the input signal is beyond the operating range region of AGC, the receiving process can be performed within the safety margin. However, there is deviation after the input signal is quantized, and the quantized noise is expressed by defining a signal-to-quantization noise ratio (SQNR). A peak clipping noise has an impact on the receiving process. If it is desired to reasonably set the AGC processing range, powers of the aforementioned quantization noise or the peak clipping noise need to be accurately calculated. Therefore, how to accurately calculate the quantization noise power or the peak clipping noise power becomes an urgent problem to be solved.

SUMMARY

The present disclosure is to provide a method for obtaining a noise power and a terminal, to solve a problem of how to accurately calculate a quantization noise power or a peak clipping noise power.

In order to achieve the foregoing objective, embodiments of the present disclosure provide a method for obtaining a noise power, including:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining the noise power according to the first power offset value, the target AGC backoff value, and a current AGC received power.

The obtaining the first power offset value of the actual automatic gain control (AGC) received power relative to the first predetermined received power within the predetermined transmission time interval (TTI) includes: obtaining the first power offset value according to a difference between the actual AGC received power and the first predetermined received power within the predetermined TTI.

The obtaining the first power offset value according to the difference between the actual AGC received power and the first predetermined received power within the predetermined TTI includes:

obtaining actual AGC received powers corresponding to respective power sampling points in the predetermined TTI;

obtaining difference values between the actual AGC received powers corresponding to the respective power sampling points and the first predetermined received power; and obtaining the power offset value according to an average value of at least one of the difference values.

The obtaining the noise power according to the first power offset value, the target AGC backoff value, and the current AGC received power includes:

obtaining a target received power according to a second predetermined received power and the first power offset value;

obtaining a second power offset value according to a difference between the current AGC received power and the target received power; and obtaining a quantization noise power or a peak clipping noise power according to the difference between the second power offset value and the target AGC backoff value.

The obtaining the noise power according to the first power offset value, the target AGC backoff value, and the current AGC received power includes:

subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

The correspondence between the modulation mode and the AGC backoff value is obtained according to the number of analog-to-digital converter (ADC) bits and a modulation mode supported by a system.

In order to achieve the foregoing objective, embodiments of the present disclosure further provide a terminal, including: a transceiver, a memory, a processor, and a computer program that is stored in the memory and executable on the processor. When executing the computer program, the processor is configured to implement following steps:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining a noise power according to the first power offset value, the target AGC backoff value, and a current AGC received power.

When executing the computer program, the processor is further configured to implement following steps: obtaining the first power offset value according to a difference between the actual AGC received power and the first predetermined received power within the predetermined TTI.

When executing the computer program, the processor is further configured to implement following steps:

obtaining actual AGC received powers corresponding to respective power sampling points in the predetermined TTI;

obtaining difference values between the actual AGC received powers corresponding to the respective power sampling points and the first predetermined received power; and obtaining the power offset value according to an average value of at least one of the difference values.

When executing the computer program, the processor is further configured to implement following steps:

obtaining a target received power according to a second predetermined received power and the first power offset value;

obtaining a second power offset value according to a difference between the current AGC received power and the target received power; and obtaining a quantization noise power or a peak clipping noise power according to the difference between the second power offset value and the target AGC backoff value.

When executing the computer program, the processor is further configured to implement following steps:

subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

The correspondence between the modulation mode and the AGC backoff value is obtained according to the number of analog-to-digital converter (ADC) bits and a modulation mode supported by a system.

In order to achieve the foregoing objective, embodiments of the present disclosure further provide a computer-readable storage medium, on which a computer program is stored. The computer program is executed by a processor to implement steps of the above method for obtaining a noise power.

In order to achieve the foregoing objective, embodiments of the present disclosure further provide a terminal, including:

a first obtaining module, configured to obtain a first power offset value of an actual automatic gain control (AGC) received power relative to a first predetermined received power within a predetermined transmission time interval (TTI);

a second obtaining module, configured to obtain, according to a preset correspondence between a modulation mode and an AGC backoff value, a target AGC backoff value corresponding to a current modulation mode; and a third obtaining module, configured to obtain a noise power according to the first power offset value, the target AGC backoff value, and a current AGC received power.

The third obtaining module includes:

a first obtaining submodule, configured to obtain a target received power according to a second predetermined received power and the first power offset value;

a second obtaining submodule, configured to obtain a second power offset value according to a difference between the current AGC received power and the target received power; and a third obtaining submodule, configured to obtain a quantization noise power or a peak clipping noise power according to the difference between the second power offset value and the target AGC backoff value.

The third obtaining module includes:

a fourth obtaining submodule, configured to subtract the first power offset value from the target AGC backoff value to obtain an updated target AGC backoff value;

a fifth obtaining submodule, configured to obtain the third power offset value according to a difference between the current AGC received power and the second predetermined received power; and a sixth obtaining submodule, configured to obtain a quantization noise power or a peak clipping noise power according to a difference between the third power offset value and the updated target AGC backoff value.

The embodiments of the present disclosure have the following beneficial effects. The above technical solution according to the embodiments of the present disclosure includes: obtaining a first power offset value of an actual automatic gain control (AGC) received power relative to a first predetermined received power within a predetermined transmission time interval (TTI); obtaining, according to a preset correspondence between a modulation mode and an AGC backoff value, a target AGC backoff value corresponding to a current modulation mode; and obtaining the noise power according to the first power offset value, the target AGC backoff value, and a current AGC received power. In the embodiments of the present disclosure, the noise power can be accurately calculated according to the first power offset value of the actual AGC received power in the predetermined TTI relative to the first predetermined received power, and the target AGC backoff value corresponding to the current modulation mode, and the noise power can be set to a reasonable AGC operating range region, thereby reducing the probability of reception failure caused by the saturated receiver due to unreasonable AGC settings.

BRIEF DESCRIPTION OF THE DRAWINGS

In order to explain technical solutions of embodiments of the present disclosure more clearly, the accompanying drawings used in the description of the embodiments of the present disclosure will be briefly introduced hereinafter. Obviously, the drawings in the following description are only some embodiments of the present disclosure. For those of ordinary skill in the art, other drawings can be obtained from these drawings without creative effort.

DETAILED DESCRIPTION

Technical solutions in the embodiments of the present disclosure will be described clearly and completely in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

Figure 2:
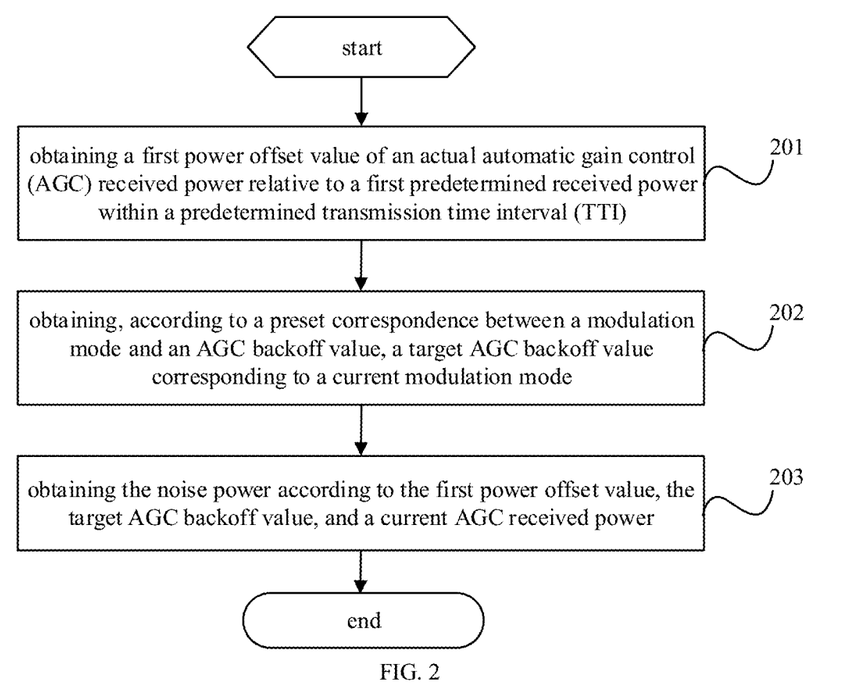
FIG. 2 is a flowchart of a method for obtaining a noise power according to embodiments of the present disclosure.

As shown in FIG. 2, embodiments of the present disclosure provide a method for obtaining a noise power, which includes the following steps.

Step 201: obtaining a first power offset value of an actual automatic gain control (AGC) received power relative to a first predetermined received power within a predetermined transmission time interval (TTI).

The predetermined TTI (transmission time interval) is a long TTI, and the above-mentioned first predetermined received power is a power calculated according to information received in an AGC time period of the predetermined TTI.

There is an AGC region at the headmost of the long TTI. All transmitting node(s) of a long TTI and transmitting node(s) of a short TTI that perform service transmission within the long TTI need to send information in the AGC area, so that a receiving node sets the AGC according to the sum of all the received powers, that is, the above-mentioned first predetermined received power.

The actual AGC received power includes actual AGC received powers of a plurality of preset power sampling points in the predetermined TTI.

Step 202: obtaining, according to a preset correspondence between a modulation mode and an AGC backoff value, a target AGC backoff value corresponding to a current modulation mode.

The correspondence between the modulation mode and the AGC backoff value is obtained according to the number of analog-to-digital conversion (ADC) bits and a modulation mode supported by a system.

Specifically, first, curves of signal-to-quantization noise ratios (SQNR) and backoff values corresponding to different modulation modes are obtained according to the given number of ADC bits and a modulation mode supported in the system; second, SQNR peak values corresponding to different modulation modes are obtained according to the curves of SQNR-backoff corresponding to different modulation modes; then considering the influence of a quantization noise and a peak clipping noise, offset values relative to the SQNR peak values are set according to receiving performances, and AGC backoff values corresponding to different modulation modes are calculated; and finally, the correspondence between different modulation modes supported in the system and AGC backoff values is established in the given number of ADC bits.

Step 203: obtaining the noise power according to the first power offset value, the target AGC backoff value, and a current AGC received power.

The noise power includes a quantization noise power or a peak clipping noise power. By introducing the first power offset value and the target AGC backoff value, the quantization noise power or the peak clipping noise power can be accurately calculated, and an AGC operating range region can be set reasonably according to the noise power, thereby reducing the probability of reception failure of a receiver caused by unreasonable AGC settings.

Further, the obtaining the first power offset value of the actual automatic gain control (AGC) received power relative to the first predetermined received power within the predetermined transmission time interval (TTI) in the foregoing step 201 includes: obtaining the first power offset value according to a difference between the actual AGC received power and the first predetermined received power within the predetermined TTI.

Specifically, actual AGC received powers corresponding to respective power sampling points in the predetermined TTI are obtained; difference values between the actual AGC received powers corresponding to the respective power sampling points and the first predetermined received power are obtained; and the power offset value is obtained according to an average value of at least one of the difference values.

In embodiments of the present disclosure, since a long TTI service and a short TTI service may exist at the same time, system time needs to be divided according to a duration of the long TTI; and within the duration of each long TTI, the system time is divided into more detailed periods according to a duration of the short TTI.

Figure 3:
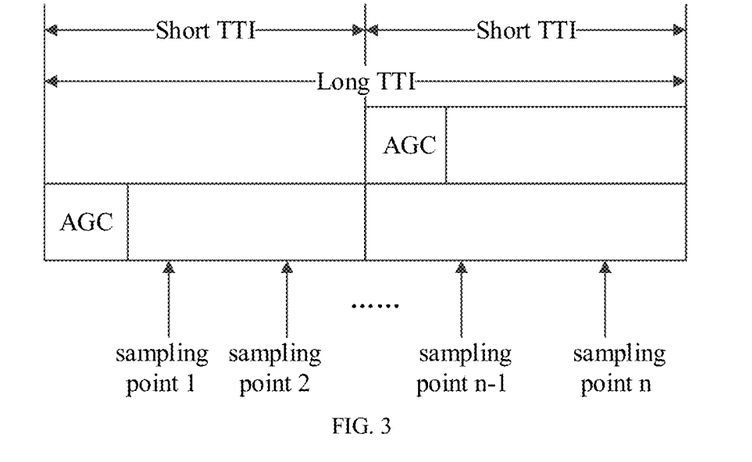
FIG. 3 is a schematic diagram of setting n received power sampling points in a long TTI according to embodiments of the present disclosure.

In the duration corresponding to the long TTI, n received power sampling points are set. As shown in FIG. 3, after setting AGC in an AGC time region at the beginning of the long TTI, a node receiving the long TTI service calculates a received power at each of the received power sampling points, the received power of each power sampling point is recorded as P(m), where m=1, 2, . . . , n.

A difference P(m)diff between P(m) and the received power PAGC set in the AGC time region is compared, and P_Offset is set to record a difference between a historical received power P(m) and PAGC. Specifically, an average value of the differences P(m)diff corresponding to M sampling points is taken as P_Offset.

For systems in the related art, the AGC is set only according to the received long TTI service, since different services have different TTI cycles, the set AGC may not meet the requirements when the short TTI is received, which causes the receiver to be saturated and the reception to be failed. In the embodiments of the present disclosure, the influence of different TTIs mixed in the system is taken into account, the noise power is calculated according to the difference between the historical received power P(m) and PAGC, so that a calculated result is more accurate, and the noise power can be set to a reasonable AGC operating range region, thereby reducing the probability of reception failure caused by the saturated receiver due to unreasonable AGC settings.

As a first optional implementation manner, the obtaining the noise power according to the first power offset value, the target AGC backoff value, and the current AGC received power in the foregoing step 203 includes: obtaining a target received power according to a second predetermined received power and the first power offset value; obtaining a second power offset value according to a difference between the current AGC received power and the target received power; and obtaining a quantization noise power or a peak clipping noise power according to the difference between the second power offset value and the target AGC backoff value.

The above-mentioned second predetermined received power is a power calculated according to information received in an AGC time period of a subsequent TTI. The subsequent TTI is a TTI located after the predetermined TTI, and the subsequent TTI is a long TTI.

It is assumed that there are two kinds of TTIs in the system, which are long TTI and short TTI, two modulation modes supported in the system are quadrature phase shift keying (QPSK) and 16 quadrature amplitude modulation (QAM). It is assumed that the number of ADC bits supported in the system is 10. According to the given number of ADC bits and the modulation modes supported in the system, a correspondence between different modulation modes supported in the system and AGC backoff values is shown in Table 1:

TABLE 1

| modulation mode | AGC backoff |
|---|---|
| QPSK | −11 dB |
| 16QAM | −13 dB |

It is assumed that a long TTI service and a short TTI service coexist in the system, a cycle of the long TTI is 1 ms, and a cycle of the short TTI is 0.5 ms. The system time is divided according to a duration of the long TTI of 1 ms, and within the duration corresponding to each long TTI, more detailed time periods are divided according to a duration of the short TTI, so that there are 2 short TTIs in one long TTI. It is assumed that a node receiving a long TTI service sets the AGC receiving power PAGC to −92.3 dBm in the AGC time region at the beginning of the long TTI.

Figure 4:
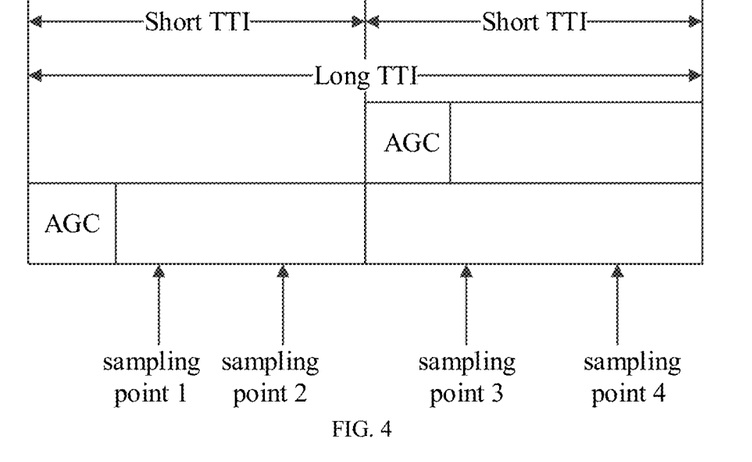
FIG. 4 is a schematic diagram of setting four received power sampling points in a long TTI according to embodiments of the present disclosure.

It is assumed that 4 received power sampling points are set in one long TTI, as shown in FIG. 4, a received power is calculated at each received power sampling point, and the received powers of the respective power sampling points are: P(1)=−92.7 dBm, P(2)=−91.5 dBm, P(3)=−72.5 dBm, P(4)=−68.8 dBm; then a difference P(m)diff between P(m) and PAGC is compared to obtain: P(1)diff=−0.4 dB, P(2)diff=0.8 dB, P(3)diff=19.8 dB, P(4)diff=23.5 dB; and P_Offset is an average value of P(1) to P(4), that is P_Offset=10.93 dB.

It is assumed PAGC of the next long TTI is equal to −88.6 dBm, PAGC+P_Offset=−88.6 dBm+10.93 dB=−77.67 dBm is used as the target received power.

A modulation mode corresponding to a received service is QPSK, the AGC backoff determined by the modulation mode is obtained as BOmod=−11 dB, by looking up a relationship table between QPSK and AGC backoff value; and a difference between the current AGC received power and the above target received power is obtained as the second power offset value.

Therefore, in subsequent long TTI reception and processing, an offset of the above-mentioned second power offset value relative to BOmod is used to calculate a quantization noise or a peak clipping noise.

In this implementation, the AGC received power of the long TTI is adjusted according to the first power offset value (the second predetermined received power plus the first power offset value), and a quantization noise power or a peak clipping noise power is obtained according to the adjusted AGC received power.

As a second optional implementation manner, the obtaining the noise power according to the first power offset value, the target AGC backoff value, and the current AGC received power in the foregoing step 203 includes: subtracting the first power offset value from the target AGC backoff value to obtain an updated target AGC backoff value; obtaining a third power offset value according to a difference between the current AGC received power and the second predetermined received power; and obtaining a quantization noise power or a peak clipping noise power according to a difference between the third power offset value and the updated target AGC backoff value.

The above-mentioned second predetermined received power is a power calculated according to information received in an AGC time period of the subsequent TTI. The subsequent TTI is a TTI located after the predetermined TTI, and the subsequent TTI is a long TTI.

It is assumed that there are two kinds of TTIs in the system, which are long TTI and short TTI, two modulation modes supported in the system are quadrature phase shift keying (QPSK) and 16 quadrature amplitude modulation (QAM). It is assumed that the number of ADC bits supported in the system is 10. According to the given number of ADC bits and the modulation modes supported in the system, a correspondence between different modulation modes supported in the system and AGC backoff values is shown in Table 1.

It is assumed that a long TTI service and a short TTI service coexist in the system, a cycle of the long TTI is 1 ms, and a cycle of the short TTI is 0.5 ms. The system time is divided according to a duration of the long TTI of 1 ms, and within the duration corresponding to each long TTI, more detailed time periods are divided according to a duration of the short TTI, so that there are 2 short TTIs in each long TTI. It is assumed that a node receiving a long TTI service sets the AGC receiving power PAGC to −92.3 dBm in the AGC time region at the beginning of the long TTI.

It is assumed that 4 received power sampling points are set in one long TTI, as shown in FIG. 4, a received power is calculated at each received power sampling point, and the received powers of the respective power sampling points are: P(1)=−92.7 dBm, P(2)=−91.5 dBm, P(3)=−72.5 dBm, P(4)=−68.8 dBm; then a difference P(m)diff between P(m) and PAGC is compared to obtain: P(1)diff=−0.4 dB, P(2)diff=0.8 dB, P(3)diff=19.8 dB, P(4)diff=23.5 dB; and P_Offset is an average value of P(1) to P(4), that is P_Offset=10.93 dB.

It is assumed PAGC of the next long TTI is equal to −88.6 dBm, a modulation mode corresponding to a received service is QPSK, and by looking up a relationship table between QPSK and AGC backoff value, the AGC backoff determined by the modulation mode is obtained as BOmod=−11 dB.

On the basis of BOmod determined by the modulation mode, BOmod is subtracted by P_Offset to obtain the updated BOmod, that is BOnew=BOmod−P_Offset=−11 dB−10.93 dB=−21.93 dB.

In the subsequent long TTI receiving process, a power offset of the current AGC received power relative to PAGC=−88.6 dBm is obtained as the third power offset value, and a quantization noise or a peak clipping noise is calculated based on an offset of the third power offset value relative to BOnew=−21.93 dB.

In this implementation manner, the AGC backoff value is adjusted according to the first power offset value (the target AGC backoff value is subtracted by the first power offset value), and the quantization noise power or the peak clipping noise power is obtained according to the adjusted AGC backoff value. According to the first power offset value between the actual AGC received power in the predetermined TTI and the first predetermined received power, and the target AGC backoff value corresponding to the current modulation mode, the noise power can be accurately calculated, and the noise power can be set to a reasonable AGC operating range region, thereby reducing the phenomenon of reception failure caused by the saturated receiver due to unreasonable AGC settings.

Figure 5:
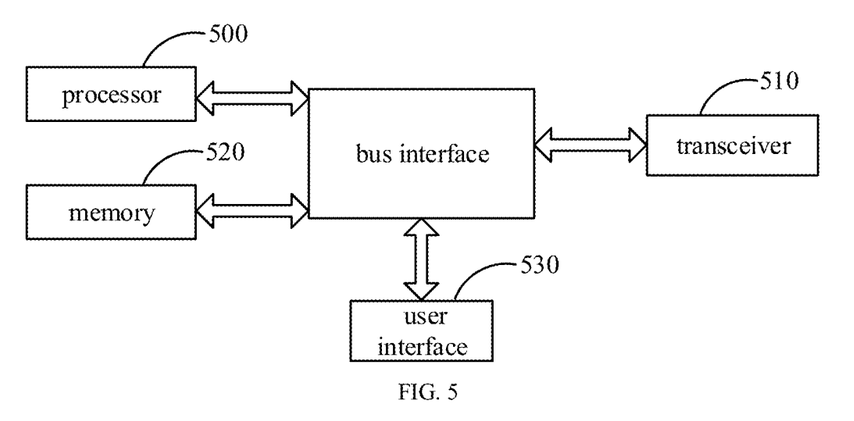
FIG. 5 is a structural block diagram of a terminal according to embodiments of the present disclosure.

As shown in FIG. 5, embodiments of the present disclosure further provide a terminal, including: a transceiver, a memory, a processor, and a computer program stored in the memory and executable on the processor. When executing the computer program, the processor is configured to implement the following steps:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining a noise power according to the first power offset value, the target AGC backoff value, and a current AGC received power.

In FIG. 5, the bus architecture may include any number of interconnected buses and bridges. Specifically, various circuits of one or more processors represented by the processor 500 and a memory represented by the memory 520 are linked together. The bus architecture can also link various other circuits such as peripherals, voltage regulators, power management circuits, etc., which are all known in the art, and therefore, no further descriptions thereof are provided herein. A bus interface provides interfaces. The transceiver 510 may be a plurality of elements, that is, including a transmitter and a receiver, and provide a unit for communicating with various other devices on a transmission medium. For different user equipment, the user interface 530 may also be an interface capable of connecting externally or internally with the required equipment. The connected equipment includes but not limited to a keypad, a display, a speaker, a microphone, a joystick, and the like.

The processor 500 is responsible for managing the bus architecture and general processing, and the memory 520 may store data used by the processor 500 when performing operations.

The processor 500 is further configured to read the program in the memory 520, and execute the following steps: obtaining the first power offset value according to a difference between the actual AGC received power and the first predetermined received power within the predetermined TTI.

The processor 500 is further configured to read the program in the memory 520, and execute the following steps:

obtaining actual AGC received powers corresponding to respective power sampling points in the predetermined TTI;

obtaining difference values between the actual AGC received powers corresponding to the respective power sampling points and the first predetermined received power; and obtaining the power offset value according to an average value of at least one of the difference values.

The processor 500 is further configured to read the program in the memory 520, and execute the following steps:

obtaining a target received power according to a second predetermined received power and the first power offset value;

obtaining a second power offset value according to a difference between the current AGC received power and the target received power; and obtaining a quantization noise power or a peak clipping noise power according to the difference between the second power offset value and the target AGC backoff value.

The processor 500 is further configured to read the program in the memory 520, and execute the following steps:

subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

The correspondence between the modulation mode and the AGC backoff value is obtained according to the number of analog-to-digital converter (ADC) bits and a modulation mode supported by a system.

In some embodiments of the present disclosure, a computer-readable storage medium is further provided, on which a computer program is stored, and the program is executed by a processor to implement the following steps:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining a noise power according to the first power offset value, the target AGC backoff value, and a current AGC received power.

When the program is executed by the processor, all the implementation manners in the above-mentioned method for obtaining a noise power can be implemented. To avoid repetition, details are not described herein.

Figure 6:
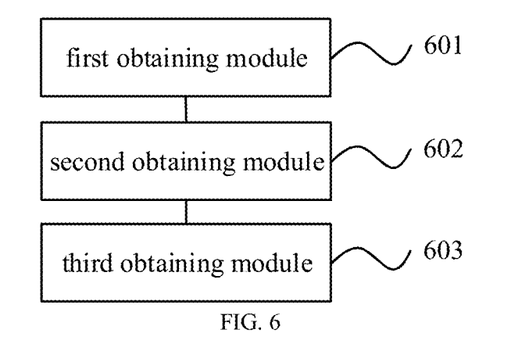
FIG. 6 is a schematic diagram of modules of a terminal according to embodiments of the present disclosure.

As shown in FIG. 6, embodiments of the present disclosure further provide a terminal, including:

a first obtaining module 601, configured to obtain a first power offset value of an actual automatic gain control (AGC) received power relative to a first predetermined received power within a predetermined transmission time interval (TTI);

a second obtaining module 602, configured to obtain, according to a preset correspondence between a modulation mode and an AGC backoff value, a target AGC backoff value corresponding to a current modulation mode; and a third obtaining module 603, configured to obtain a noise power according to the first power offset value, the target AGC backoff value, and a current AGC received power.

In the terminal according to an embodiment of the present disclosure, the first obtaining module 601 is configured to obtain the first power offset value according to a difference between the actual AGC received power and the first predetermined received power within the predetermined TTI.

In the terminal according to an embodiment of the present disclosure, the first obtaining module 601 includes:

a seventh obtaining submodule, configured to obtain actual AGC received powers corresponding to respective power sampling points in the predetermined TTI;

an eighth obtaining submodule, configured to obtain difference values between the actual AGC received powers corresponding to the respective power sampling points and the first predetermined received power; and a ninth obtaining submodule, configured to obtain the power offset value according to an average value of at least one of the difference values.

In the terminal according to an embodiment of the present disclosure, the third obtaining module 603 includes:

a first obtaining submodule, configured to obtain a target received power according to a second predetermined received power and the first power offset value;

a second obtaining submodule, configured to obtain a second power offset value according to a difference between the current AGC received power and the target received power; and a third obtaining submodule, configured to obtain a quantization noise power or a peak clipping noise power according to the difference between the second power offset value and the target AGC backoff value.

In the terminal according to an embodiment of the present disclosure, the third obtaining module 603 includes:

a fourth obtaining submodule, configured to subtract the first power offset value from the target AGC backoff value to obtain an updated target AGC backoff value;

a fifth obtaining submodule, configured to obtain a third power offset value according to a difference between the current AGC received power and the second predetermined received power; and a sixth obtaining submodule, configured to obtain a quantization noise power or a peak clipping noise power according to a difference between the third power offset value and the updated target AGC backoff value.

In the terminal according to an embodiment of the present disclosure, the correspondence between the modulation mode and the AGC backoff value is obtained according to the number of analog-to-digital converter (ADC) bits and a modulation mode supported by a system.

The terminal of the embodiment of the present disclosure can accurately calculate a noise power according to the first power offset value between the actual AGC received power in the predetermined TTI and the first predetermined received power, and the target AGC backoff value corresponding to the current modulation mode. Furthermore, the noise power can be set to a reasonable AGC operating range region, thereby reducing the phenomenon of reception failure caused by the saturated receiver due to unreasonable AGC settings.

In the various embodiments of the present disclosure, it should be understood that the size of the sequence numbers of the foregoing processes does not mean an execution order, and the execution order of each process should be determined by its function and internal logic, and should not constitute any limitation to implementation processes of the embodiments of the present disclosure.

The above are preferred embodiments of the present disclosure. It should be pointed out that those of ordinary skill in the art can make several improvements and modifications without departing from the principle of the present disclosure, and these improvements and modifications should be regarded within the protection scope of the present disclosure.

What is claimed is:

1. A method for obtaining a noise power, comprising:
obtaining a first power offset value of an actual automatic gain control (AGC) received power relative to a first predetermined received power within a predetermined transmission time interval (TTI);
obtaining, according to a preset correspondence between a modulation mode and an AGC backoff value, a target AGC backoff value corresponding to a current modulation mode; and
obtaining the noise power according to the first power offset value, the target AGC backoff value, and a current AGC received power.

2. The obtaining method according to claim 1, wherein the obtaining the first power offset value of the actual automatic gain control (AGC) received power relative to the first predetermined received power within the predetermined transmission time interval (TTI) comprises:
obtaining the first power offset value according to a difference between the actual AGC received power and the first predetermined received power within the predetermined TTI.

3. The obtaining method according to claim 2, wherein the obtaining the first power offset value according to the difference between the actual AGC received power and the first predetermined received power within the predetermined TTI comprises:
obtaining actual AGC received powers corresponding to respective power sampling points in the predetermined TTI;
obtaining difference values between the actual AGC received powers corresponding to the respective power sampling points and the first predetermined received power; and
obtaining the power offset value according to an average value of at least one of the difference values.

4. The obtaining method according to claim 1, wherein the obtaining the noise power according to the first power offset value, the target AGC backoff value, and the current AGC received power comprises:
obtaining a target received power according to a second predetermined received power and the first power offset value;
obtaining a second power offset value according to a difference between the current AGC received power and the target received power; and
obtaining a quantization noise power or a peak clipping noise power according to the difference between the second power offset value and the target AGC backoff value.

5. The obtaining method according to claim 1, wherein the obtaining the noise power according to the first power offset value, the target AGC backoff value, and the current AGC received power comprises:
subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

6. The obtaining method according to claim 1, wherein the correspondence between the modulation mode and the AGC backoff value is obtained according to the number of analog-to-digital converter (ADC) bits and a modulation mode supported by a system.

7. A terminal, comprising: a transceiver, a memory, a processor, and a computer program that is stored in the memory and executable on the processor, wherein when executing the computer program, the processor is configured to implement following steps:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining a noise power according to the first power offset value, the target AGC backoff value, and a current AGC received power.

8. The terminal according to claim 7, wherein when executing the computer program, the processor is further configured to implement following steps:

obtaining the first power offset value according to a difference between the actual AGC received power and the first predetermined received power within the predetermined TTI.

9. The terminal according to claim 8, wherein when executing the computer program, the processor is further configured to implement following steps:

obtaining actual AGC received powers corresponding to respective power sampling points in the predetermined TTI;

obtaining difference values between the actual AGC received powers corresponding to the respective power sampling points and the first predetermined received power; and obtaining the power offset value according to an average value of at least one of the difference values.

10. The terminal according to claim 7, wherein when executing the computer program, the processor is further configured to implement following steps:

obtaining a target received power according to a second predetermined received power and the first power offset value;

obtaining a second power offset value according to a difference between the current AGC received power and the target received power; and obtaining a quantization noise power or a peak clipping noise power according to the difference between the second power offset value and the target AGC backoff value.

11. The terminal according to claim 7, wherein when executing the computer program, the processor is further configured to implement following steps:

subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

12. The terminal according to claim 7, wherein the correspondence between the modulation mode and the AGC backoff value is obtained according to the number of analog-to-digital converter (ADC) bits and a modulation mode supported by a system.

13. A non-transitory computer-readable storage medium, wherein a computer program is stored thereon, and the computer program is executed by a processor to implement steps:

obtaining a first power offset value of an actual automatic gain control (AGC) received power relative to a first predetermined received power within a predetermined transmission time interval (TTI);

obtaining, according to a preset correspondence between a modulation mode and an AGC backoff value, a target AGC backoff value corresponding to a current modulation mode; and obtaining the noise power according to the first power offset value, the target AGC backoff value, and a current AGC received power.

14. The non-transitory computer-readable storage medium according to claim 13, wherein the computer program is executed by the processor to implement steps:

obtaining the first power offset value according to a difference between the actual AGC received power and the first predetermined received power within the predetermined TTI.

15. The non-transitory computer-readable storage medium according to claim 14, wherein the computer program is executed by the processor to implement steps:

obtaining actual AGC received powers corresponding to respective power sampling points in the predetermined TTI;

obtaining difference values between the actual AGC received powers corresponding to the respective power sampling points and the first predetermined received power; and obtaining the power offset value according to an average value of at least one of the difference values.

16. The non-transitory computer-readable storage medium according to claim 13, wherein the computer program is executed by the processor to implement steps:

obtaining a target received power according to a second predetermined received power and the first power offset value;

obtaining a second power offset value according to a difference between the current AGC received power and the target received power; and obtaining a quantization noise power or a peak clipping noise power according to the difference between the second power offset value and the target AGC backoff value.

17. The non-transitory computer-readable storage medium according to claim 13, wherein the computer program is executed by the processor to implement steps:

subtracting the first power offset value from the target AGC backoff value to obtain an updated target AGC backoff value;

obtaining a third power offset value according to a difference between the current AGC received power and the second predetermined received power; and obtaining a quantization noise power or a peak clipping noise power according to a difference between the third power offset value and the updated target AGC backoff value.

18. The non-transitory computer-readable storage medium according to claim 13, wherein the correspondence between the modulation mode and the AGC backoff value is obtained according to the number of analog-to-digital converter (ADC) bits and a modulation mode supported by a system.

* * * * *